United States Patent [19]

Lockhart, Jr.

[11] 4,152,644
[45] May 1, 1979

[54] FIXTURE FOR TESTING INTEGRATED CIRCUITS

[75] Inventor: James A. Lockhart, Jr., Basking Ridge, N.J.

[73] Assignee: Burroughs Corporation, Detroit, Mich.

[21] Appl. No.: 912,093

[22] Filed: Jun. 2, 1978

[51] Int. Cl.² .................... G01R 31/22; G01R 31/02
[52] U.S. Cl. ............................ 324/158 F; 324/73 R
[58] Field of Search ............ 324/158 F, 158 R, 73 R; 339/75 M, 176 P, 176 M

[56] References Cited

PUBLICATIONS

Dougherty, R. A.; "DIP Switch Isolates Faults in System"; Electronics, May 15, 1975, p. 112.

*Primary Examiner*—Rudolph V. Rolinec
*Assistant Examiner*—Ernest F. Karlsen

*Attorney, Agent, or Firm*—Kevin R. Peterson; Robert A. Green; Edward J. Feeney, Jr.

[57] ABSTRACT

The fixture comprises an insulating housing of synthetic resinous material which carries two sets of switches which number, in total, the number of terminals on an integrated circuit (IC) to be tested. Each switch has a manually operable arm or lever which can be placed in three separate positions, an upper position, a center position, and a lower position; and the switch has three terminals, an upper terminal, a center terminal, and a lower terminal, one for each position of the operable arm. All of the upper switch terminals are connected together to a first common plug, and all of the lower switch terminals are connected together to a second common plug, the two plugs being adapted to be inserted into a test device such as a curve tracer. Each center terminal is connected separately to a terminal on a zero-insertion force socket, into which the pins of the integrated circuit under test can be inserted.

1 Claim, 3 Drawing Figures

FIXTURE FOR TESTING INTEGRATED CIRCUITS

BACKGROUND OF THE INVENTION

Test equipment for examining the characteristics of integrated circuits (ICs) are available; however, one of the most popular of these requires patch cords to select pins on the integrated circuit which are to be connected to the curve tracer sweep outputs. The use of these patch cords is time consuming. In addition, since the patch cords are flexible, they may create repeatability problems caused by varying inductive loops, etc. Also, in this known apparatus, the IC socket does not lend itself to fast insertion. The present invention solves these problems by providing a fixture which allows very rapid set-up, good repeatability, and plugs directly into the curve tracer.

DESCRIPTION OF THE PREFERRRED EMBODIMENTS

Figure 1:
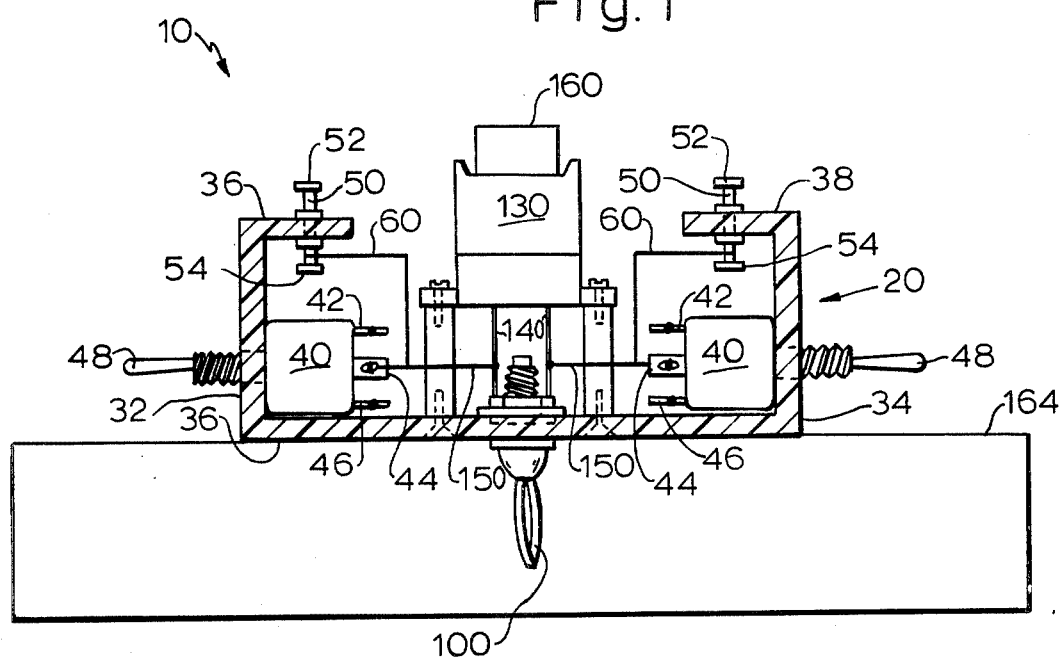
FIG. 1 is a front elevational view of the invention.
Figure 2:
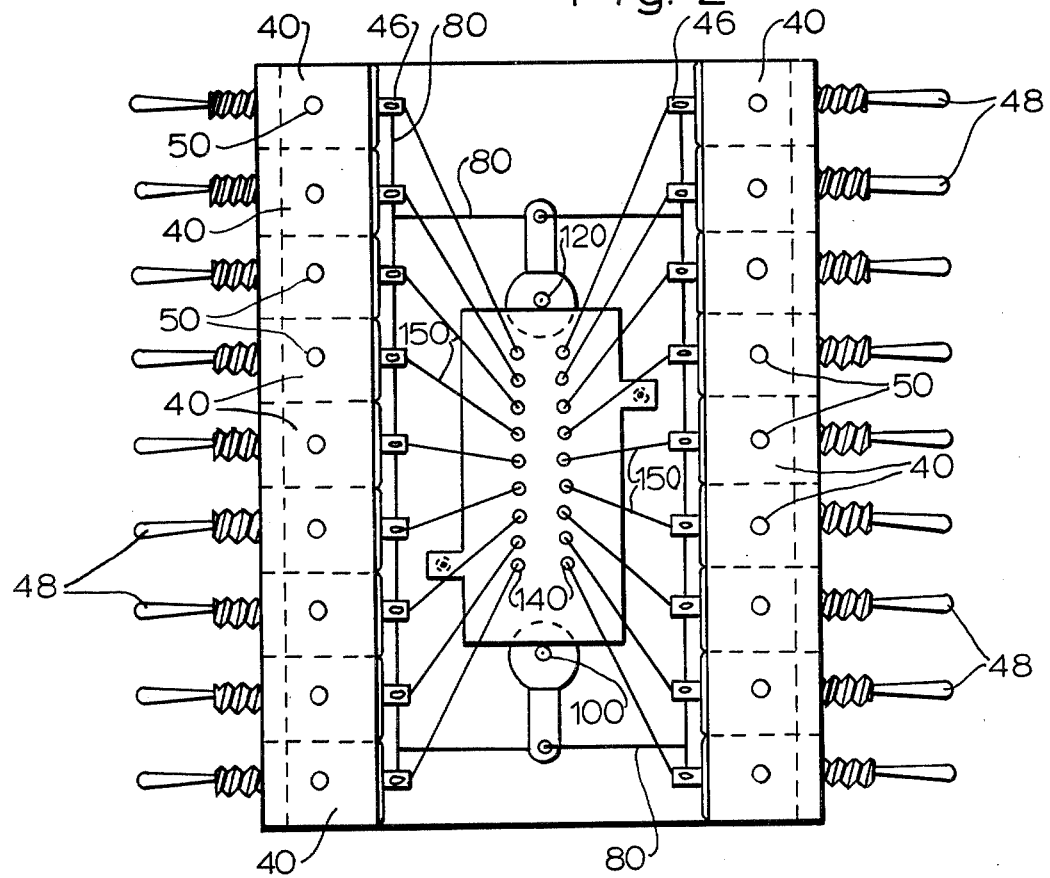
FIG. 2 is a bottom plan view of the invention.
Figure 3:
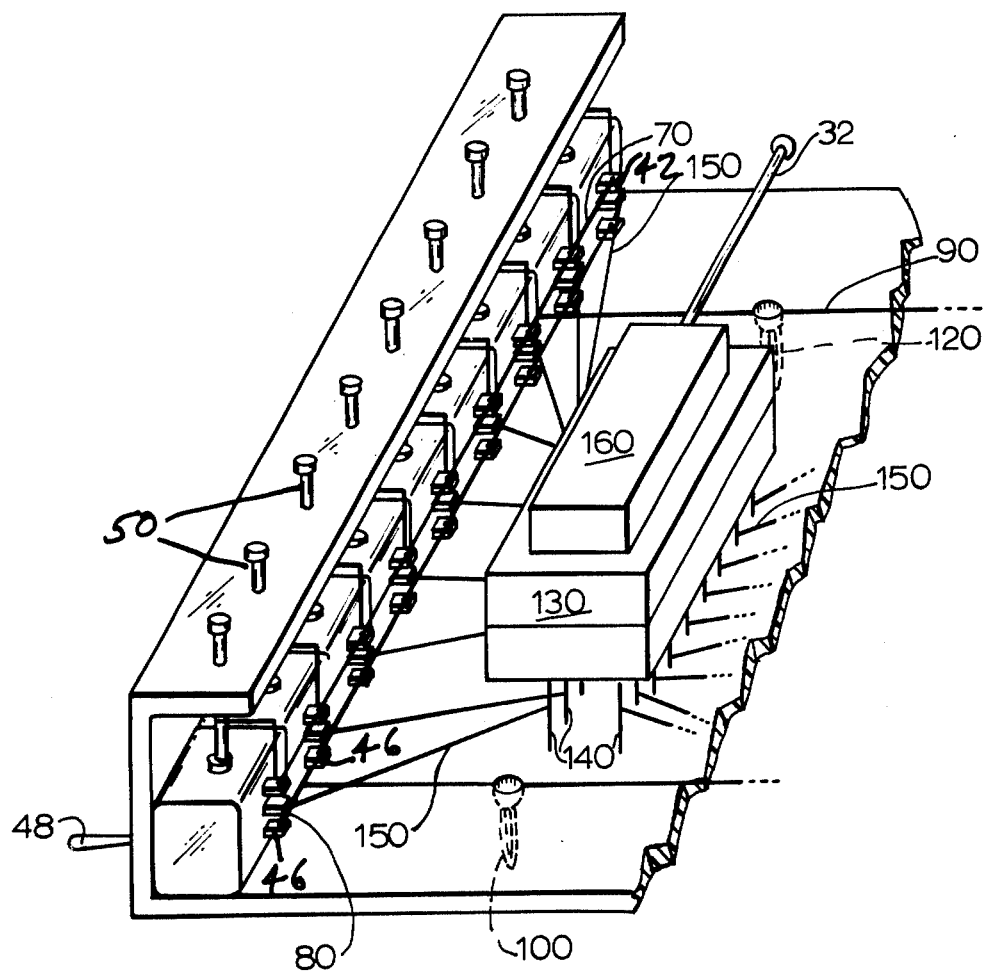
FIG. 3 is a perspective view of a portion of the apparatus of the invention.

The apparatus or test fixture of the invention 10 is adapted for coupling an integrated circuit to test apparatus, for example, a curve tracer, and, as described, it is adapted for testing eighteen-pin integrated circuits (ICs) although it will be clear to those skilled in the art that suitable modifications may be made to test ICs with a larger number of pins.

The fixture 10 comprises an insulating housing 20 of a synthetic resinous material such as Lucite and includes a large-area base 30, left and right side walls 32 and 34 which terminate in upper narrow lip portions 36 and 38 which lie generally parallel to the base. Eighteen switches 40 are secured to the base, nine being along each side wall, with the switch operating arms 48 extending through the side walls and accessible to an operator outside the walls. Each switch includes an upper terminal 42, a center terminal 44, and a lower terminal 46. Nine terminals 50 are secured along each upper lip in alignment with a switch 40 beneath it, and they are mounted to provide an outer portion 52 and an inner portion 54, and each inner portion 54 is coupled by a rigid bus 60 to the center terminal of the switch beneath it. A rigid bus 70 connects together the upper switch terminals 42 on each nine switches 40, and a similar rigid bus 80 connects together the lower switch terminals 46 of each set of nine switches.

The two lower buses 80 are connected by a rigid bus 90 to a banana plug 100 secured in the base 30 of the housing 20 and extending downwardly therefrom, and the two upper buses 70 are connected by a rigid bus 110 to a second similar banana plug 120 secured in the base of the housing.

A zero-insertion force, lever-operated socket 130 for an eighteen-pin integrated circuit (IC) (one suitable type is made by Textool) is secured to the base 30 between the two rows of switches 40, and eighteen terminals or pins 140 extend from the lower surface thereof and are embedded in the base 30. Each center terminal 44 is connected to one of the terminals 140 by a lead 150.

In using the invention, an IC package 160 is inserted in the socket 130, by operating lever 132, with the fixture 10 itself mounted on the test apparatus 164 such as a curve tracer. If it is desired to connect a particular IC pin or pins 140 to the emitter circuit of the curve tracer, then the appropriate switch 48 is depressed so that terminal 46 is connected in the test circuit. If it is desired to connect the IC pin or pins to the collector output of the curve tracer, then the appropriate switches 48 are raised so that terminals 42 are connected in the test circuit. If the switch arms are placed in the center or off position, an external voltage or signal may be applied to the appropriate terminals 50 and through terminals 44 to selected IC pins 140.

The advantages of the invention will be clear to those skilled in the art. First, it can be seen that, since all connections can be rigid buses, the electrical characteristics of the test fixture remain constant. In addition, the provision of a zero-insertion force connector simplifies the coupling of an IC package to the next fixture, and the switch arrangement simplifies the connection of the IC pins into the desired test circuit.

What is claimed is:
1. A test fixture comprising
an insulating housing including a relatively large-area base,
two parallel left and right L-shaped side walls,
first and second insertion plugs secured to said base and adapted to couple said fixture to test apparatus,
a socket for receiving an integrated circuit having an array of pins extending from the bottom thereof and secured to said base between said first and second plugs,
an array of switches supported on said base adjacent to each of said side walls, each switch including an operating arm which extends through the side wall and first, second and third terminals, all of the first terminals being connected together and all of the third terminals being connected together, each second terminal being electrically connected to one of said pins, and
a plurality of auxiliary pins secured to said side walls and each connected to a second terminal of a switch.

* * * * *